United States Patent
Tien et al.

(10) Patent No.: US 11,942,364 B2
(45) Date of Patent: Mar. 26, 2024

(54) SELECTIVE DEPOSITION OF A PROTECTIVE LAYER TO REDUCE INTERCONNECT STRUCTURE CRITICAL DIMENSIONS

(71) Applicant: Taiwan Semiconductor Manufacturing Company, Ltd., Hsin-Chu (TW)

(72) Inventors: Hsi-Wen Tien, Xinfeng Township (TW); Chung-Ju Lee, Hsinchu (TW); Chih Wei Lu, Hsinchu (TW); Hsin-Chieh Yao, Hsinchu (TW); Yu-Teng Dai, New Taipei (TW); Wei-Hao Liao, Taichung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 20 days.

(21) Appl. No.: 17/868,845

(22) Filed: Jul. 20, 2022

(65) Prior Publication Data

US 2022/0352017 A1 Nov. 3, 2022

Related U.S. Application Data

(62) Division of application No. 17/012,427, filed on Sep. 4, 2020, now Pat. No. 11,521,896.

(Continued)

(51) Int. Cl.
*H01L 21/768* (2006.01)
*H01L 21/311* (2006.01)
(Continued)

(52) U.S. Cl.
CPC .. *H01L 21/76831* (2013.01); *H01L 21/76813* (2013.01); *H01L 23/5226* (2013.01);
(Continued)

(58) Field of Classification Search
CPC ......... H01L 21/76897; H01L 21/76877; H01L 21/76834; H01L 21/76831; H01L 23/5226; H01L 23/53238
See application file for complete search history.

(56) References Cited

U.S. PATENT DOCUMENTS 7,094,669 B2   8/2006   Bu et al.
9,831,183 B2   11/2017  Lin et al.
(Continued)

OTHER PUBLICATIONS

Notice of Allowance dated Jul. 20, 2022 for U.S. Appl. No. 17/012,427.

(Continued)

*Primary Examiner* — Jaehwan Oh
*Assistant Examiner* — John M Parker
(74) *Attorney, Agent, or Firm* — Eschweiler & Potashnik, LLC

(57) ABSTRACT

In some embodiments, the present disclosure relates to a method of forming an interconnect. The method includes forming an etch stop layer (ESL) over a lower conductive structure and forming one or more dielectric layers over the ESL. A first patterning process is performed on the one or more dielectric layers to form interconnect opening and a second patterning process is performed on the one or more dielectric layers to increase a depth of the interconnect opening and expose an upper surface of the ESL. A protective layer is selectively formed on sidewalls of the one or more dielectric layers forming the interconnect opening. A third patterning process is performed to remove portions of the ESL that are uncovered by the one or more dielectric layers and the protective layer and to expose the lower conductive structure. A conductive material is formed within the interconnect opening.

20 Claims, 14 Drawing Sheets

Related U.S. Application Data

(60) Provisional application No. 62/951,147, filed on Dec. 20, 2019.

(51) Int. Cl.
 *H01L 23/522* (2006.01)
 *H01L 27/092* (2006.01)

(52) U.S. Cl.
 CPC ... *H01L 21/31116* (2013.01); *H01L 21/31144* (2013.01); *H01L 21/7684* (2013.01); *H01L 27/092* (2013.01)

(56) References Cited

U.S. PATENT DOCUMENTS

| | | |
|---|---|---|
| 10,770,288 B2 | 9/2020 | Chi et al. |
| 11,094,788 B2 | 8/2021 | Yu et al. |
| 2009/0239375 A1* | 9/2009 | Riess ............... H01L 21/76808 438/689 |
| 2014/0004678 A1* | 1/2014 | Lim .................... H10B 12/033 438/381 |
| 2015/0270156 A1* | 9/2015 | Lin ................... H01L 21/76843 438/618 |
| 2017/0278747 A1 | 9/2017 | Adusumilli et al. |
| 2019/0221475 A1 | 7/2019 | Hong et al. |
| 2021/0057273 A1 | 2/2021 | Chen et al. |
| 2021/0098360 A1 | 4/2021 | Chandhok et al. |
| 2021/0134660 A1 | 5/2021 | Wang et al. |
| 2021/0287994 A1 | 9/2021 | Sueh et al. |
| 2021/0351079 A1 | 11/2021 | Su et al. |
| 2023/0011391 A1* | 1/2023 | Yao .................. H01L 21/76834 |

OTHER PUBLICATIONS

Coventor. "Back End of Line (BEOL) Technology Integration." The date of publication is unknown. Retrieved online on Jul. 1, 2020 from https://www.coventor.com/semiconductor-solutions/logic/beol/.

Non-Final Office Action dated Dec. 24, 2021 for U.S. Appl. No. 17/012,427.

* cited by examiner

SELECTIVE DEPOSITION OF A PROTECTIVE LAYER TO REDUCE INTERCONNECT STRUCTURE CRITICAL DIMENSIONS

REFERENCE TO RELATED APPLICATIONS

This Application is a Divisional of U.S. application Ser. No. 17/012,427, filed on Sep. 4, 2020, which claims the benefit of U.S. Provisional Application No. 62/951,147, filed on Dec. 20, 2019. The contents of the above-referenced Patent Applications are hereby incorporated by reference in their entirety.

BACKGROUND

As dimensions and feature sizes of semiconductor integrated circuits (ICs) are scaled down, the density of the elements forming the ICs is increased and the spacing between elements is reduced. Such spacing reductions are limited by light diffraction of photolithography, mask alignment, isolation and device performance among other factors. As the distance between any two adjacent conductive features decreases, the resulting capacitance increases, which will increase power consumption and time delay. Thus, manufacturing techniques and device design are being investigated to reduce IC size while maintaining or improving performance of the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
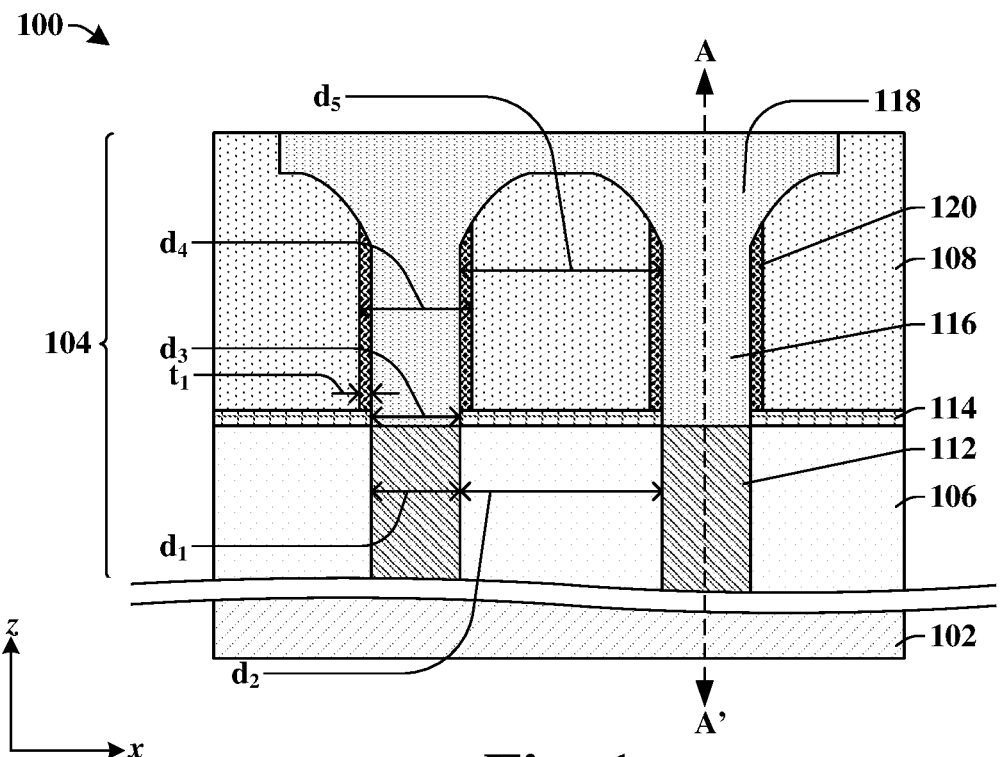
FIG. 1 illustrates a cross-sectional view of some embodiments of an integrated chip having an interconnect structure comprising an interconnect via and an interconnect wire coupled to the interconnect via, wherein outer sidewalls of the interconnect via are surrounded by a protective layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the manufacturing of an integrated chip, during back-end-of-line processing, a dual damascene process is often used to form an interconnect structure comprising a network of interconnect wires and interconnect vias to couple devices together. In a dual damascene process, an interconnect via and an interconnect wire may be formed during a same set of processing steps to save time, materials, and costs during manufacturing. For example, in the dual damascene process, one or more interconnect dielectric layers are deposited over an underlying interconnect wire or contact, for example. A first removal process may be conducted to etch through the one or more interconnect dielectric layers, thereby forming a first trench structure. A bottom surface of the first trench structure may be defined by an etch stop layer arranged between the underlying interconnect via or contact and a lowermost one of the interconnect dielectric layers. A second removal process may be performed to remove portions of the etch stop layer, thereby exposing the underlying interconnect via or contact. Then, a third removal process is performed to remove portions of a topmost one of the interconnect dielectric layers to form a second trench structure that is coupled to the first trench structure. In some embodiments, the first trench structure defines an interconnect via to be formed, and the second trench structure defines an interconnect wire to be formed. In some embodiments, the first and second trench structures are filled with a conductive material, and a planarization process is performed to remove excess conductive material, thereby forming an interconnect via that is directly between an interconnect wire and the underlying interconnect wire or contact.

As dimensions of interconnect structures are reduced to increase device density, controlling the critical dimension of the interconnect via is challenging due to manufacturing limitations (e.g., photolithography limitations, mask alignment precision/accuracy, etc.). For example, the interconnect via may be misaligned over an underlying interconnect wire; the interconnect via may be wider than the underlying interconnect wire; and/or portions of the one or more dielectric layers and/or an underlying dielectric layer surrounding the underlying interconnect wire or contact may be unintentionally removed or damaged due to the number of etching processes used. As a result, capacitance between the interconnect via and other surrounding conductive features may be increased; the one or more interconnect dielectric layers may breakdown over time; or the like may occur that reduces the reliability and/or lifespan of the integrated chip.

Thus, various embodiments of the present disclosure provide a method of forming an interconnect via using a selective deposition process of a protective layer during the dual damascene process to reduce the critical dimension of the interconnect via. In such embodiments, after forming the first and second trench structures but prior to depositing the conductive material, a protective layer is selectively deposited on the one or more interconnect dielectric layers and not on an etch stop layer that defines a bottom surface of the first trench structure. This way, in some embodiments, a width or in other words, a critical dimension, of the first trench structure may be reduced by the protective layer. Further, after the selective deposition of the protective layer, exposed portions of the etch stop layer may be removed by an etchant to expose the underlying interconnect via or contact, and in such embodiments, the protective layer may have a slower removal rate by the etchant than the etch stop layer. Thus, the protective layer may prevent the removal and/or damage of the one or more interconnect dielectric layers, in some embodiments. As a result, in some embodiments, the protective layer reduces the critical dimension of the interconnect via while also maintaining and/or increasing the reliability of the overall integrated chip.

FIG. 1 illustrates a cross-sectional view 100 of some embodiments of an integrated chip comprising an interconnect via laterally surrounded by a protective layer.

The integrated chip of FIG. 1 includes an interconnect structure 104 arranged over a substrate 102. In some embodiments, the interconnect structure 104 comprises a lower conductive structure 112 arranged over the substrate 102; an interconnect via 116 arranged over and coupled to the lower conductive structure 112; and an interconnect wire 118 arranged over and coupled to the interconnect via 116. In some embodiments, the interconnect structure 104 may further comprise a lower interconnect dielectric layer 106 surrounding the lower conductive structure 112, and a first interconnect dielectric layer 108 arranged over the lower interconnect dielectric layer 106 and surrounding the interconnect via 116 and the interconnect wire 118. In some embodiments, an etch stop layer 114 may be arranged directly between the lower interconnect dielectric layer 106 and the first interconnect dielectric layer 108.

In some embodiments, more than one lower conductive structure 112 is arranged within the lower interconnect dielectric layer 106, and more than one interconnect via 116 is arranged within the first interconnect dielectric layer 108. In some embodiments, the interconnect wire 118 may be coupled to more than one interconnect via 116. In some embodiments the lower conductive structure 112 may have a width equal to a first distance $d_1$, and the lower conductive structure 112 may be spaced apart from a neighboring lower conductive structure 112 by a second distance $d_2$. In some embodiments, the interconnect via 116 may have a width equal to a third distance $d_3$, and the interconnect via 116 may be spaced apart from a neighboring interconnect via 116 by a fifth distance $d_5$. In some embodiments, the third distance $d_3$ is less than or equal to the first distance $d_1$. In some embodiments, the fifth distance $d_5$ may be greater than or equal to the second distance $d_2$.

Further, in some embodiments, the interconnect structure 104 may be coupled to one or more semiconductor devices (e.g., transistors, inductors, capacitors, etc.) and/or memory devices (not shown) disposed over and/or within the substrate 102. Thus, the conductive features (e.g., the lower conductive structure 112, the interconnect via 116, the interconnect wire 118) of the interconnect structure 104 may be electrically coupled to one another and to any underlying or overlying devices to provide a conductive pathway for signals (e.g., voltage, current) traveling through the integrated chip.

In some embodiments, the integrated chip of FIG. 1 further includes a protective layer 120 arranged on outer sidewalls of the interconnect via 116. In some embodiments, the protective layer 120 may comprise a dielectric material, such as, for example, silicon carbide, silicon oxygen carbide, silicon dioxide, silicon nitride, silicon carbon nitride, silicon oxynitride, silicon oxygen carbon nitride, or a metal oxide such as, for example, aluminum oxide or aluminum nitrogen oxide. In some embodiments, the protective layer 120 comprises a different material than the first interconnect dielectric layer 108 and a different material than the etch stop layer 114. The protective layer 120 comprises a material that may be selectively deposited on the first interconnect dielectric layer 108 and not on the etch stop layer 114. In some embodiments, the protective layer 120 may have a first thickness $t_i$ in a range of between, for example, approximately 10 angstroms and approximately 800 angstroms. In some embodiments, the protective layer 120 also is arranged on outer sidewalls and surfaces of the interconnect wire 118 (e.g., FIG. 12C). Thus, in some embodiments, the protective layer 120 separates the interconnect via 116 from the first interconnect dielectric layer 108, and also in some embodiments, separates the interconnect wire 118 from the first interconnect dielectric layer 108. In some embodiments, the protective layer 120 directly contacts upper surfaces of the etch stop layer 114. In some embodiments, the protective layer 120 directly overlies the lower interconnect dielectric layer 106.

In some embodiments, during manufacturing, the protective layer 120 is selectively deposited in trench structures in the first interconnect dielectric layer 108 prior to forming the interconnect via 116 and the interconnect wire 118 in the trench structures. Further, prior to forming the protective layer 120, the trench structures that the interconnect via 116 would be formed in have a width equal to a fourth distance $d_4$. Thus, the protective layer 120 reduces the critical dimension, or the width, of the interconnect via 116 from the fourth distance $d_4$ to the third distance $d_3$. After the protective layer 120 is formed on the first interconnect dielectric layer 108, portions of the etch stop layer 114 are removed to expose the lower conductive structure 112. In such embodiments, the protective layer 120 may be substantially resistant to removal by and/or have a slower rate of removal by the etchant used to remove the portions of the etch stop layer 114. This way, the protective layer 120 reduces the width of the interconnect via 116 from the fourth distance $d_4$ to the third distance $d_3$ and also protects the first interconnect dielectric layer 108 from unintentional removal and/or damage by future etching steps. Because the protective layer 120 reduces the critical dimension of the interconnect via 116, the interconnect via 116 is more reliably aligned over the lower conductive structure 112, and the fifth distance $d_5$ is increased thereby reducing capacitance between neighboring interconnect vias 116 to increase reliability of the interconnect structure 104.

Figure 2:
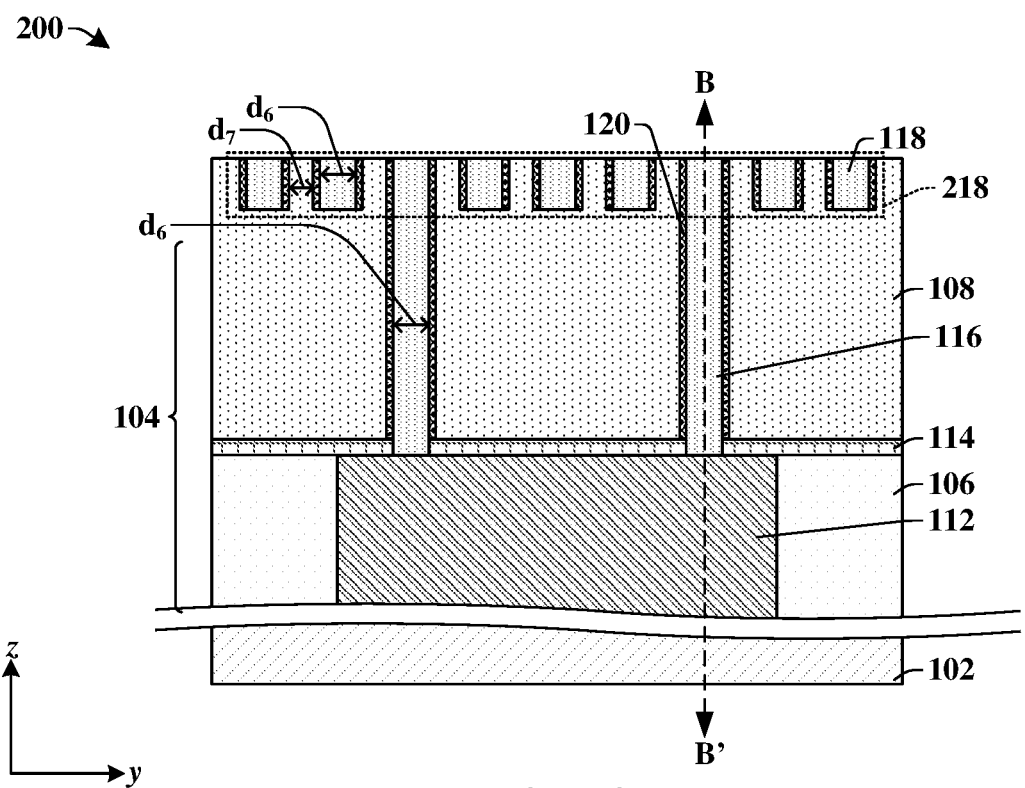
FIG. 2 illustrates a cross-sectional view of some other embodiments of an integrated chip having an interconnect structure comprising an interconnect via and an interconnect wire coupled to the interconnect via, wherein outer sidewalls of the interconnect via are surrounded by a protective layer.

FIG. 2 illustrates a cross-sectional view 200 of some other embodiments of an integrated chip comprising an interconnect via laterally surrounded by a protective layer.

In some embodiments, cross-section line BB' of the cross-sectional view 200 of FIG. 2 corresponds to the cross-sectional view 100 of FIG. 1, and cross-section line AA' of the cross-sectional view 100 of FIG. 1 corresponds to the cross-sectional view 200 of FIG. 2. For example, in some embodiments, the cross-sectional view 100 of FIG. 1 corresponds to an xz-plane of an integrated chip, whereas the cross-sectional view 200 of FIG. 2 corresponds to a yz-plane of the same integrated chip, wherein the xz-plane is normal to the yz-plane. It will be appreciated that other relationships between FIGS. 1 and 2 or lack of a relationship between FIGS. 1 and 2 are also within the scope of the disclosure.

In some embodiments, more than one interconnect via 116 is coupled to the lower conductive structure 112. Further, in some embodiments, from the perspective of the cross-sectional view 200 of FIG. 2, multiple interconnect wires 218 are arranged within the first interconnect dielectric layer 108 and extend into and out of the page. In some embodiments, the interconnect via 116 couples the interconnect wire 118 to the lower conductive structure 112. Other ones of the multiple interconnect wires 218 may be coupled to a different lower conductive structure that can be seen from a different cross-sectional view than the cross-sectional view 200 of FIG. 2.

In some embodiments, outer sidewalls of each interconnect wire 118 are laterally surrounded by the protective layer 120. In some embodiments, the protective layer 120 is not arranged below bottom surfaces of the multiple interconnect wires 218, whereas in other embodiments, the protective layer 120 may be arranged directly between the bottom surfaces of the multiple interconnect wires 218 and the first interconnect dielectric layer 108 (e.g., FIG. 12D). In some embodiments, the interconnect wire 118 and the interconnect via 116 have a width equal to a sixth distance $d_6$ from the cross-sectional view 200. In some embodiments, the protective layer 120 also reduces the width (i.e., the sixth distance $d_6$), or the critical dimension, of the interconnect wire 118, thereby reducing the size of the integrated chip. Further, the protective layer 120 increases a seventh distance $d_7$ arranged between each interconnect wire 118 to reduce the capacitance between the multiple interconnect wires 218 thereby reducing cross-talk between the multiple interconnect wires 218 and increasing the reliability of the integrated chip.

Figure 3:
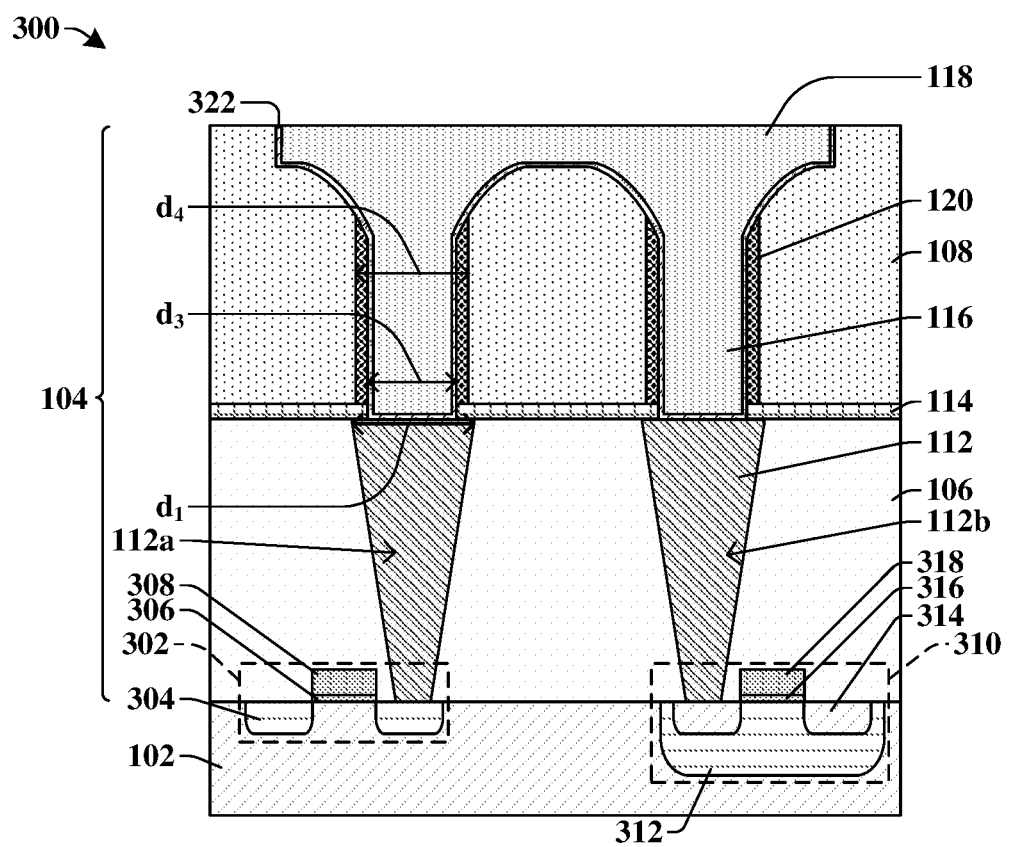
FIG. 3 illustrates a cross-sectional view of some alternative embodiments of FIG. 1, wherein a diffusion barrier layer directly contacts outer surfaces of the interconnect wire and the interconnect via.

FIG. 3 illustrates a cross-sectional view 300 of some other embodiments of an integrated chip comprising an interconnect via laterally surrounded by a protective layer and coupled to one or more semiconductor devices.

In some embodiments, a diffusion barrier layer 322 is arranged directly on outer surfaces of the interconnect via 116 and the interconnect wire 118. Thus, in some embodiments, the diffusion barrier layer 322 directly contacts the protective layer 120, and the diffusion barrier layer 322 separates the interconnect via 116 from the protective layer 120. In some embodiments, the interconnect wire 118 and the interconnect via 116 may comprise, for example, copper, and the diffusion barrier layer 322 may comprise, for example, titanium nitride, tantalum nitride, or the like. In such embodiments, the diffusion barrier layer 322 may prevent diffusion of the interconnect via 116 and the interconnect wire 118 into the first interconnect dielectric layer 108 and thus, mitigates cross-talk. Further, in some embodiments, the diffusion barrier layer 322 may be arranged directly between the interconnect via 116 and the lower conductive structure 112.

In some embodiments, the third distance $d_3$ is measured between inner sidewalls of the protective layer 120 arranged on the interconnect via 116, and the fourth distance $d_4$ is measured between outer sidewalls of the protective layer 120 arranged on the interconnect via 116. In some embodiments, the third distance $d_3$ of the interconnect via 116 is less than the first distance $d_1$ of the lower conductive structure 112. In some embodiments, the first distance $d_1$ is a maximum width of the lower conductive structure 112, and the third distance $d_3$ is a minimum width of the interconnect via 116. In such embodiments, the protective layer 120 may directly overlie the lower conductive structure 112. Thus, in some embodiments, the etch stop layer 114 may be arranged directly between the protective layer 120 and the lower conductive structure 112.

In some embodiments, the lower conductive structure 112 may be known as a contact, a contact via, or the like. In some embodiments, the lower conductive structure 112 is coupled to an underlying semiconductor device (e.g., 302, 310). In some embodiments, a first lower conductive structure 112a may be coupled to a first semiconductor device 302. In some embodiments, the first semiconductor device 302 may comprise, for example, a field effect transistor (FET). In such embodiments, the first semiconductor device 302 may comprise first source/drain regions 304 having a first doping type (e.g., n-type) and arranged on or within the substrate 102. In some embodiments, the substrate 102 may have a second doping type (e.g., p-type) that is different from the first doping type. Further, in some embodiments, the first semiconductor device 302 may comprise a first gate electrode 308 arranged over the substrate 102 and between the first source/drain regions 304. In some embodiments, a first gate dielectric layer 306 may be arranged directly between the first gate electrode 308 and the substrate 102.

In some embodiments, a second lower conductive structure 112b may be coupled to a second semiconductor device 310. In some embodiments, the second semiconductor device 310 may comprise a FET. In such embodiments, the second semiconductor device 310 may comprise second source/drain regions 314 having the second doping type (e.g., p-type) and arranged on or within a well region 312. The well region 312 may be, in some embodiments, a doped portion of the substrate 102. In some embodiments, the well region 312 has the first doping type (e.g., n-type). In some embodiments, the second semiconductor device 310 further comprises a second gate electrode 318 arranged over the substrate 102 and between the second source/drain regions 314. In some embodiments, a second gate dielectric layer 316 may be arranged directly between the second gate electrode 318 and the substrate 102.

In some embodiments, the interconnect wire 118 couples the first semiconductor device 302 to the second semiconductor device 310. In some embodiments, the first semiconductor device 302 is a n-type MOS (NMOS), and the second semiconductor device 310 is a p-type MOS (PMOS). In such embodiments, the first and second semiconductor devices 302, 310 may together form a complementary MOS (CMOS).

Further in some embodiments, it will be appreciated that the interconnect structure 104 may couple the first and/or second semiconductor devices 302, 310 to some other semiconductor device, memory device, photo device, or some other electronic device. It will be appreciated that other electronic/semiconductor devices other than the FETs illustrated as the first and second semiconductor devices 302, 310 are also within the scope of this disclosure. For example, in some embodiments, the first and/or second semiconductor devices 302, 310 may comprise fin field-effect transistors (finFETs), gate all around field-effect transistors (GAAFET), or the like.

FIGS. 4A-12D illustrate cross-sectional views 400A-1200D of some embodiments of a method of forming an interconnect via and an interconnect wire by way of a dual damascene process and using a protective layer to reduce a critical dimension of the interconnect via and the interconnect wire. Although FIGS. 4A-12D are described in relation to a method, it will be appreciated that the structures disclosed in FIGS. 4A-12D are not limited to such a method (e.g., method 1300), but instead may stand alone as structures independent of the method.

Figure 4A:
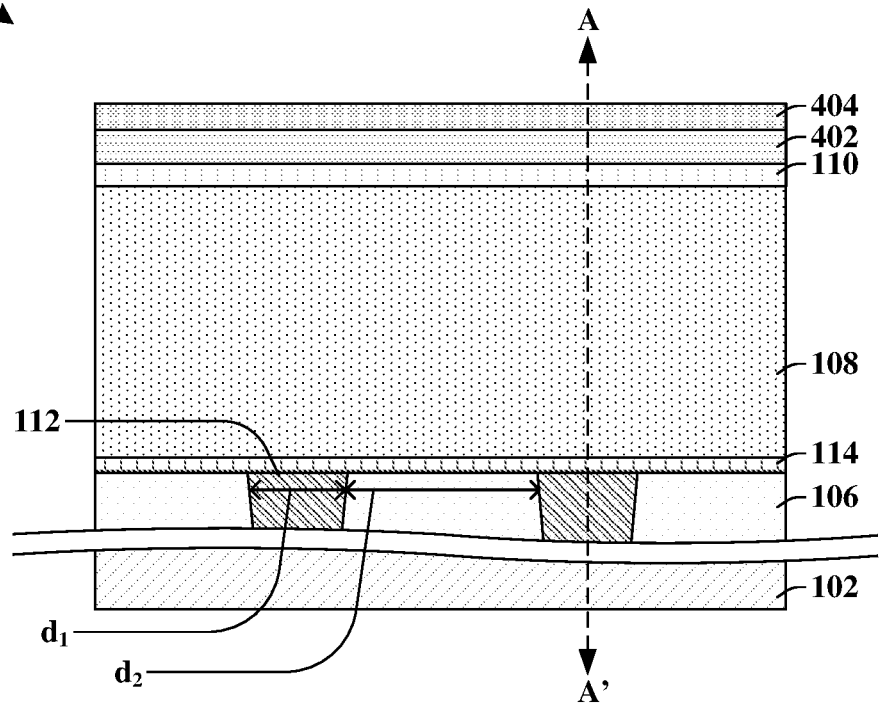
FIGS. 4A-12D illustrate cross-sectional views of some embodiments of performing a dual damascene process to form an interconnect wire over an interconnect via and within a first interconnect dielectric layer, wherein a critical dimension of the interconnect via is reduced by selectively depositing a protective layer on the first interconnect dielectric layer.

As shown in cross-sectional view 400A of FIG. 4A, a substrate 102 is provided. In some embodiments, the substrate 102 may be or comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated with. In some embodiments, a lower interconnect dielectric layer 106 is formed over the substrate 102. In some embodiments, various semiconductor devices (e.g., transistors, inductors, capacitors, etc.) and/or memory devices (not shown) may be arranged over and/or within the substrate 102 and beneath the lower interconnect dielectric layer 106. In some embodiments, a lower conductive structure 112 may be formed within the lower interconnect dielectric layer 106 and coupled to the one or more of the various semiconductor devices and/or memory devices (not shown).

In some embodiments, the lower interconnect dielectric layer 106 may have a thickness in a range of between, for example, approximately 30 angstroms and approximately 800 angstroms. In some embodiments, the lower interconnect dielectric layer 106 may comprise, for example, a low-k dielectric material such as silicon carbide, silicon dioxide, silicon oxygen carbide, silicon nitride, silicon carbon nitride, silicon oxynitride, silicon oxygen carbon nitride, or some other suitable dielectric material.

In some embodiments, the lower conductive structure 112 may be formed within the lower interconnect dielectric layer 106 through various steps of patterning (e.g., photolithography/etching), deposition (e.g., PVD, CVD, plasma-enhanced CVD (PE-CVD), ALD, sputtering, etc.), and removal (e.g., wet etching, dry etching, chemical mechanical planarization (CMP), etc.) processes. In some embodiments, the lower conductive structure 112 may be formed in a chamber set to a temperature in a range of between, for example, approximately 40 degrees Celsius and approximately 200 degrees Celsius, for example. In some embodiments, the lower conductive structure 112 may comprise a conductive material such as, for example, tantalum, tantalum nitride, titanium nitride, copper, cobalt, ruthenium, molybdenum, iridium, tungsten, or some other suitable conductive material. Further, in some embodiments, the lower conductive structure 112 may have a height in a range of between, for example, approximately 10 angstroms and approximately 1000 angstroms. In some embodiments, the lower conductive structure 112 may have a width equal to a first distance $d_1$ and may be spaced apart from a neighboring lower conductive structure 112 by a second distance $d_2$.

In some embodiments, an etch stop layer 114 is formed over the lower conductive structure 112 and over the lower interconnect dielectric layer 106. In some embodiments, the etch stop layer 114 is formed by way of a deposition process (e.g., PVD, CVD, ALD, spin-on, etc.), and may be formed in a chamber set to a temperature in a range of between, for example, approximately 150 degrees Celsius and approximately 400 degrees Celsius. In some embodiments, the etch stop layer 114 may be formed to have a thickness in a range of between, of example, approximately 10 angstroms and approximately 1000 angstroms. In some embodiments, the etch stop layer 114 may comprise, for example, silicon carbide, silicon dioxide, silicon oxygen carbide, silicon nitride, silicon carbon nitride, silicon oxynitride, silicon oxygen carbon nitride, aluminum oxygen nitride, aluminum oxide, or some other suitable material.

In some embodiments, a first interconnect dielectric layer 108 is formed over the etch stop layer 114, and a second interconnect dielectric layer 110 is formed over the first interconnect dielectric layer 108. In some embodiments, the first interconnect dielectric layer 108 and/or the second interconnect dielectric layer 110 may comprise, for example, silicon carbide, silicon dioxide, silicon oxygen carbide, silicon nitride, silicon oxynitride, silicon carbon nitride, silicon oxygen carbon nitride, aluminum oxide, aluminum oxygen nitride, or some other suitable dielectric material. In some embodiments, each of the first and second interconnect dielectric layers 108, 110 may be formed by way of a deposition process (e.g., spin-on, physical vapor deposition (PVD), chemical vapor deposition (CVD), atomic layer deposition (ALD), etc.). In some embodiments, the first and second interconnect dielectric layers 108, 110 may be formed in a chamber set to a temperature in a range of between, for example, approximately 50 degrees Celsius and approximately 400 degrees Celsius. In some embodiments, the first and second interconnect dielectric layers 108, 110 may each have a thickness in a range of between, for example, approximately 10 angstroms and approximately 800 angstroms.

In some embodiments, a first hard mask structure 402 may be formed over the second interconnect dielectric layer 110, and a second hard mask structure 404 may be formed over the first hard mask structure 402. In some embodiments, the first hard mask structure 402 and the second hard mask structure 404 may each comprise one of the following materials: titanium nitride, titanium oxide, tungsten, tungsten carbide, hafnium oxide, zirconium oxide, zinc oxide, zirconium titanium oxide, or some other suitable hard mask material. In some embodiments, the first and second hard mask structures 402, 404 may be formed in a chamber set to a temperature in a range of between, for example, approximately 50 degrees Celsius and approximately 400 degrees Celsius. In some embodiments, the first and second hard mask structures 402, 404 may each have a thickness in a range of between, for example, approximately 30 angstroms and approximately 500 angstroms.

Figure 4B:
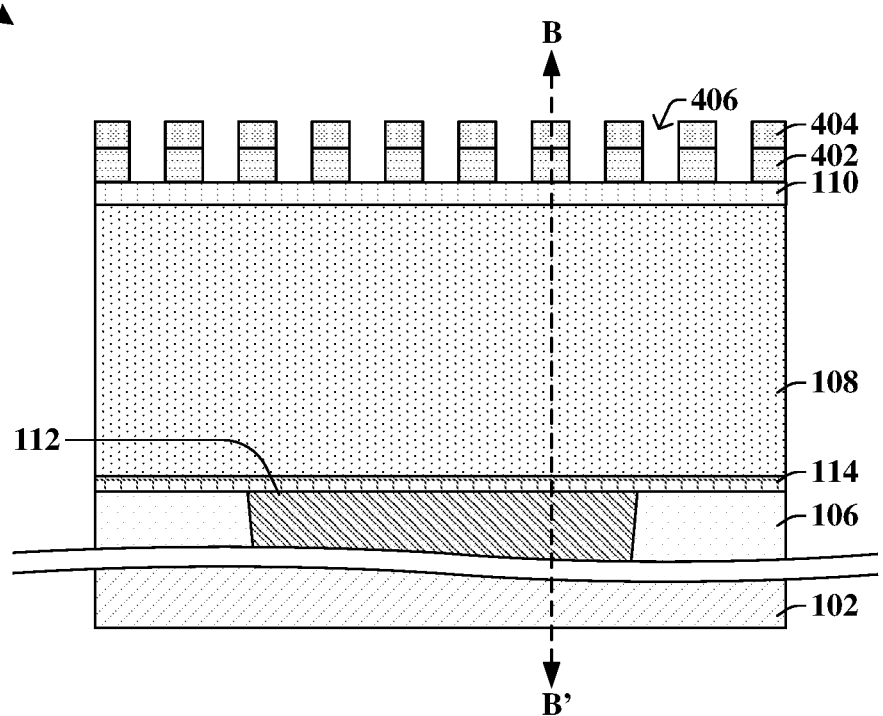

FIG. 4B illustrates a cross-sectional view 400B of some embodiments corresponding to the same integrated chip or a different integrated chip as the cross-sectional view 400A of FIG. 4A. In some embodiments, wherein FIGS. 4A and 4B are from the same integrated chip, cross-section line BB' of FIG. 4B corresponds to the cross-sectional view 400A of FIG. 4A, and cross-section line AA' of FIG. 4A corresponds to the cross-sectional view 400B of FIG. 4B. It will be appreciated that in some embodiments of the method illustrated in FIGS. 4A-12D, FIGS. 5A, 6A, 7A, 8A, 9A, 10A, 11A, and 12A may correspond to FIGS. 5B, 6B, 7B, 8B, 9B, 10B, 11B, and 12B, respectively, in the same way that FIG. 4A corresponds to FIG. 4B. It will be appreciated that the same steps described with respect to FIGS. 4A, 5A, 6A, 7A, 8A, 9A, 10A, 11A, and 12A may be conducted concurrently in FIGS. 4B, 5B, 6B, 7B, 8B, 9B, 10B, 11B, and 12B, respectively.

As shown in the cross-sectional view 400B of FIG. 4B, in some embodiments, the first and second hard mask structures 402, 404 are patterned to form first openings 406 in the first and second hard mask structures 402, 404. In some embodiments, the first and second hard mask structure 402, 404 are patterned using photolithography and removal (e.g., etching) processes. In some embodiments, the etching process using to form the first openings 406 in the first and second hard mask structures 402, 404 may be or comprise, for example, inductively coupled plasma (ICP), capacitively coupled plasma (CCP), ion beam etching (IBE), or remote plasma using one or more of the following etchant gases: $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar, $CH_3OH$, $C_2H_5OH$, or some other suitable etchant gas. In some embodiments, the etching process is conducted in a chamber set to, for example, a pressure in a range of between approximately 0.2 millitorr and approximately 120 millitorr, a temperature in a range of between approximately 0 degrees Celsius and approximately 100 degrees Celsius, a power in a range of between approximately 50 Watts and approximately 3000 Watts, and a bias in a range of between approximately 0 volts and approximately 1200 volts. In yet other embodiments, the etching process to form the first openings 406 in the first and second hard mask structure 402, 404 may comprise a wet clean etchant. It will be appreciated that other patterns in the first and second hard mask structures 402, 404 than what is shown in the cross-sectional view 400B of FIG. 4B are also within the scope of this disclosure.

Figure 5A:
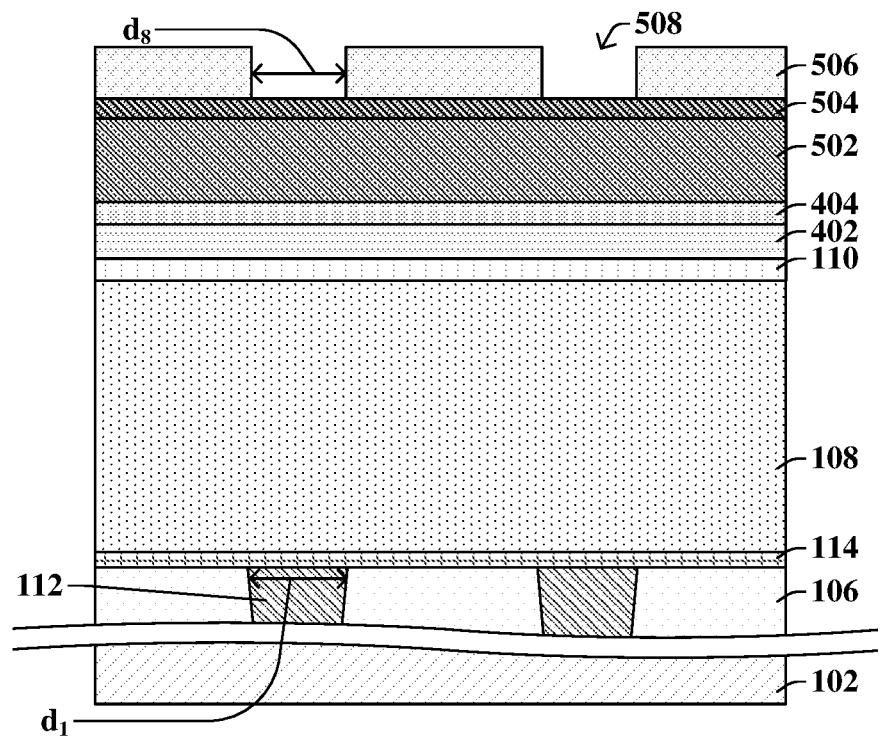

As shown in cross-sectional view 500A of FIG. 5A, in some embodiments, first and second anti-reflective layers 502, 504 are formed over the second hard mask structure 404. In some embodiments, the first and second anti-reflective layers 502, 504 aid in the precision and accuracy of future photolithography steps. In some embodiments, the first and second anti-reflective layers 502, 504 may comprise an organic or an inorganic material with anti-reflective properties. In some embodiments, the first and second anti-reflective layers 502, 504 may be formed by way of a deposition process (e.g., PVD, CVD, ALD, spin-on, etc.).

In some embodiments, a masking structure 506 comprising second openings 508 may be formed over the second anti-reflective layer 504. In some embodiments, the masking structure 506 may be formed by way of, for example, photolithography and removal (e.g., etching) processes. In some embodiments, the masking structure 506 comprises a photoresist material of a hard mask material. In some embodiments, multiple second openings 508 may be formed within the masking structure 506. Further, in some embodiments, each second opening 508 directly overlies the lower conductive structure 112. In some embodiments, the second opening 508 has a width equal to an eighth distance $d_5$. In some embodiments, the eighth distance $d_5$ is in a range of between, for example, approximately 5 nanometers and approximately 300 nanometers. In some embodiments, the eighth distance $d_5$ may be greater than, less than, or equal to the first distance $d_1$ of the lower conductive structure 112.

Figure 5B:
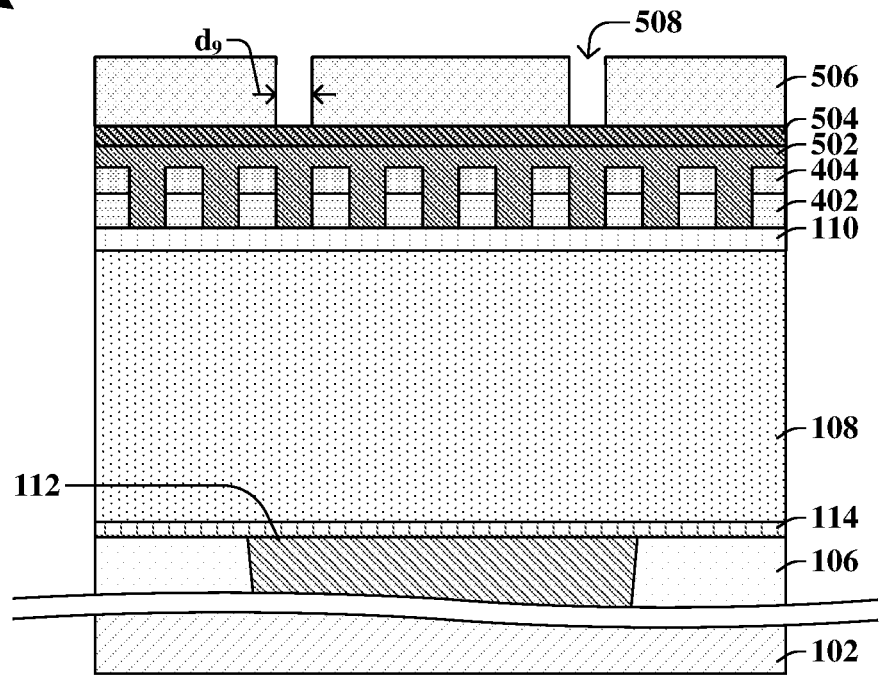

As shown in cross-sectional view 500B of FIG. 5B, the second openings 508 of the masking structure 506 may also be visible from the cross-sectional view 500B of FIG. 5B. In some embodiments, from the cross-sectional view 500B, the second openings 508 have a width equal to a ninth distance $d_9$. In some embodiments, the ninth distance $d_9$ is equal to the eighth distance ($d_5$ of FIG. 5A), whereas in other embodiments, the ninth distance $d_9$ is different than the eighth distance ($d_5$ of FIG. 5A). In some embodiments, the ninth distance $d_9$ is in a range of between, for example, approximately 5 nanometers and approximately 300 nanometers, for example.

Figure 6A:
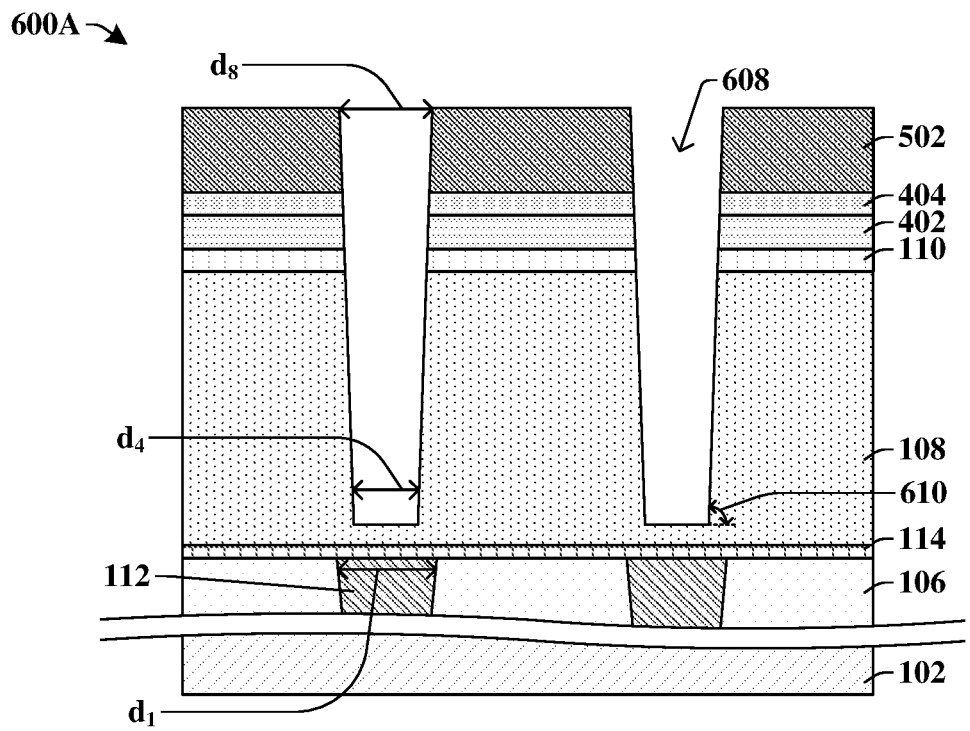

As shown in cross-sectional view 600A of FIG. 6A, in some embodiments, a first removal process is performed according to the second openings (508 of FIG. 5A) of the masking structure (506 of FIG. 5A) to form a first trench structure 608 that extends through the first and second interconnect dielectric layers 108, 110. In some embodiments, the first trench structure 608 extends completely through the first anti-reflective layer 502, the second hard mask structure 404, the first hard mask structure 402, and the second interconnect dielectric layer 110. In some embodiments, after the first removal process, the first trench structure 608 extends partially through the first interconnect dielectric layer 108, and does not expose the etch stop layer 114. In some embodiments, the first trench structure 608 are defined by inner surfaces of the first interconnect dielectric layer 108, the second interconnect dielectric layer 110, the first hard mask structure 402, the second hard mask structure 404, and the first anti-reflective layer 502. In some embodiments, the masking structure (506 of FIG. 5A) and/or the second anti-reflective layer (504 of FIG. 5A) are removed by the first removal process, or in other embodiments, the masking structure (506 of FIG. 5A) and/or the second anti-reflective layer (504 of FIG. 5A) are removed before or after the first removal process. In yet other embodiments, the masking structure (506 of FIG. 5A) and/or the second anti-reflective layer (504 of FIG. 5A) remain over the first anti-reflective layer 502 after the first removal process.

In some embodiments, the first trench structure 608 has a width that decreases as the first trench structure 608 extends closer to the etch stop layer 114. For example, in some embodiments, an upper portion of the first trench structure 608 that extends through the first anti-reflective layer 502 may have a width about equal to the eighth distance $d_5$, whereas a lower portion of the first trench structure 608 that extends through the first interconnect dielectric layer 108 may have a width equal to about a fourth distance $d_4$ that is less than the eighth distance $d_5$. In some embodiments, the fourth distance $d_4$ may be less than, greater than, or equal to the first distance $d_1$ of the lower conductive structure 112. In some embodiments, the width of the first trench structure 608 decreases as the first trench structure 608 extends closer to the etch stop layer 114 because the first trench structure 608 has angled sidewalls as a residual effect from the first removal process. In some embodiments, the sidewalls of the first trench structure 608 have a first angle 610 in a range of between, for example, approximately 40 degrees and approximately 90 degrees.

In some embodiments, the first removal process comprises a dry etching process using a reactive ion etching technique such as, for example, ICP or CCP. The first removal process may be conducted in a substantially vertical direction. In some embodiments, the first removal process may utilize one or more of the following etchant gases: $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar, $CH_3OH$, $C_2H_5OH$, or some other suitable etchant gas. Further, in some embodiments, the first removal process is conducted in a chamber set to, for example, a pressure in a range of between approximately 0.2 millitorr and approximately 120 millitorr, a temperature in a range of between approximately 0 degrees Celsius and approximately 100 degrees Celsius, a power in a range of between approximately 50 Watts and approximately 3000 Watts, and a bias in a range of between approximately 0 volts and approximately 1200 volts.

Figure 6B:
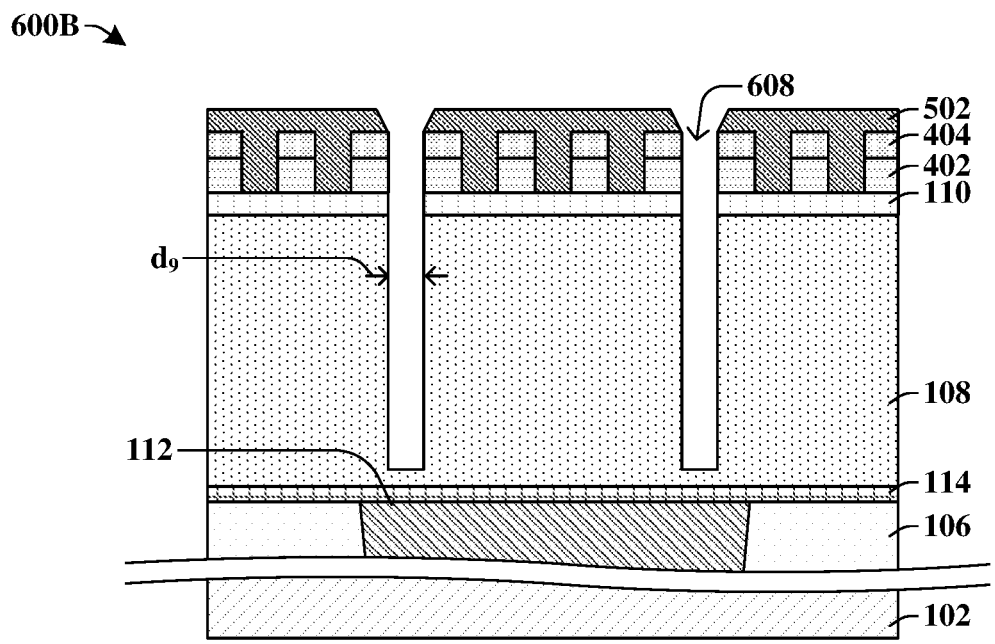

As shown in cross-sectional view 600B of FIG. 6B, in some embodiments, the first trench structure 608 may have substantially vertical sidewalls. In such embodiments, the first trench structure 608 may have a width equal to the ninth distance $d_9$ throughout the height of the first trench structure 608.

Figure 7A:
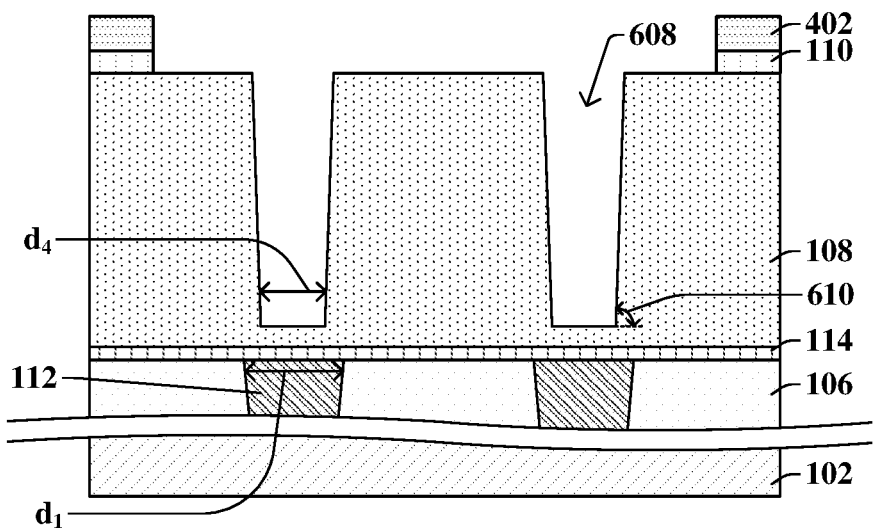

As shown in cross-sectional view 700A of FIG. 7A, in some embodiments, portions of the first anti-reflective layer (502 of FIG. 6A), the second hard mask structure (404 of FIG. 6A), and/or the second interconnect dielectric layer 110 may be removed from the first interconnect dielectric layer 108. In some embodiments, the portions of the first anti-reflective layer (502 of FIG. 6A), the second hard mask structure (404 of FIG. 6A), and/or the second interconnect dielectric layer 110 are removed using photolithography and a wet or dry etching process. In some embodiments, the first anti-reflective layer (502 of FIG. 6A), the second hard mask structure (404 of FIG. 6A), and/or the second interconnect dielectric layer 110 may be removed using an ICP, CCP, IBE or remote plasma process under the same or similar processing conditions (e.g., gases, pressure, temperature, power, bias, etc.) as described above in FIG. 4B with respect to patterning the first hard mask structure 402 and the second hard mask structure (404 of FIG. 4B). In some embodiments, the remaining portions of the second interconnect dielectric layer 110 and the first hard mask structure 402 define a second trench structure to be formed over the first trench structure 608. For example, in some embodiments, the remaining portions of the second interconnect dielectric layer 110 and the first hard mask structure 402 are arranged on outer portions of the first interconnect dielectric layer 108 and do not directly overlie the lower conductive structure 112.

Figure 7B:
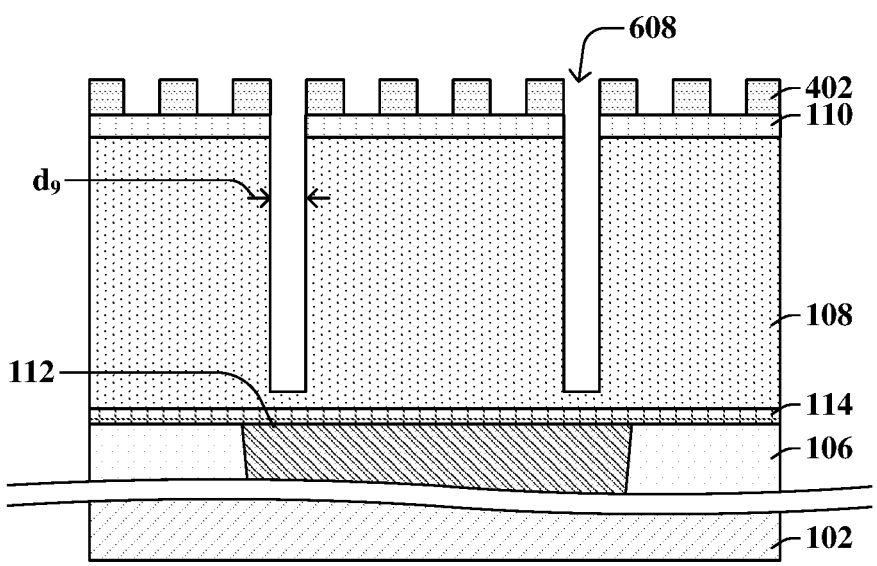

As shown in cross-sectional view 700B of FIG. 7B, in some embodiments, the first anti-reflective layer (502 of FIG. 6A) and the second hard mask structure (404 of FIG. 6A) are removed, whereas the second interconnect dielectric layer 110 and the first hard mask structure 402 are not removed from the perspective of the cross-sectional view 700B of FIG. 7B. Thus, in some embodiments, although portions of the first hard mask structure 402 and the second interconnect dielectric layer 110 are removed from the perspective of the cross-sectional view 700A of FIG. 7A, portions of the first hard mask structure 402 and the second interconnect dielectric layer 110 are not removed from the perspective of the cross-sectional view 700B of FIG. 7B. In other embodiments, portions of the first hard mask structure 402 and the second interconnect dielectric layer 110 may indeed be removed from both the cross-sectional views 700A and 700B of FIGS. 7A and 7B, respectively.

Figure 8A:
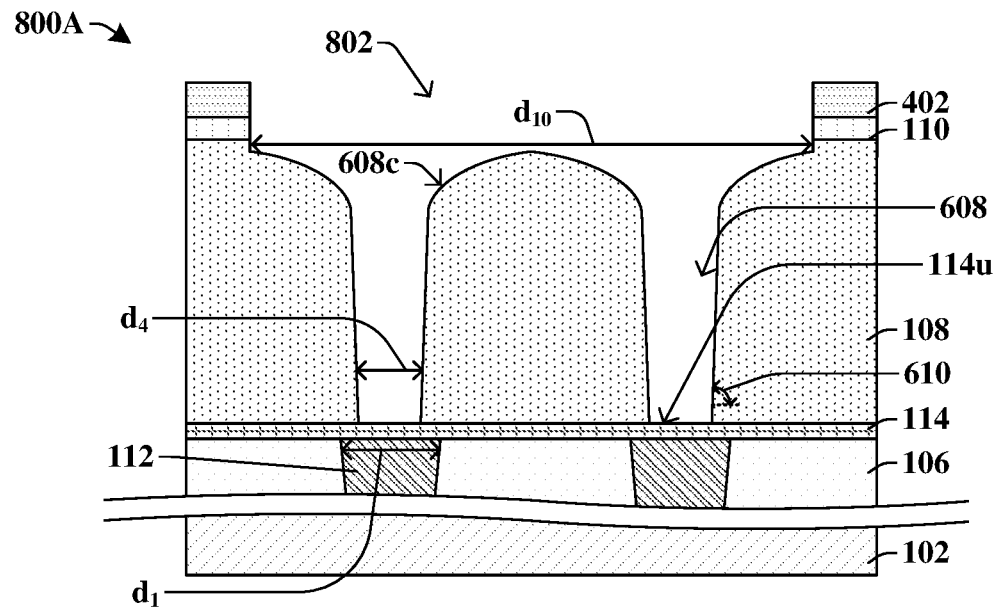

As shown in cross-sectional view 800A of FIG. 8A, in some embodiments, a second removal process may be conducted to extend the first trench structure 608 further down the first interconnect dielectric layer 108 such that an upper surface 114$u$ of the etch stop layer 114 defines a lower surface of the first trench structure 608. In some embodiments, upper surfaces of the first interconnect dielectric layer 108 that are not protected by the first hard mask structure 402 may be partially removed by the second removal process, such that the first trench structure 608 has upper curved sidewalls 608$c$. In some embodiments, the second removal process may comprise a dry etching process such as ICP or CCP under the same or similar processing conditions (e.g., gases, pressure, temperature, power, bias, etc.) as the first removal process as described with respect to forming the first trench structure 608 in FIG. 6A.

Further, in some embodiments, a second trench structure 802 may be formed within the first interconnect dielectric layer 108 that is fluidly connected to the first trench structure 608. In some embodiments, the second trench structure 802 is where an interconnect wire will be formed and coupled to an interconnect via that will be formed within the first trench structure 608. In some embodiments, a width of the second trench structure 802 is equal to a tenth distance $d_{10}$ that may be in a range of between, for example, approximately 5 nanometers and approximately 3000 nanometers. Further, in some embodiments, the second trench structure 802 may have outer sidewalls that are slanted by an angle in a range of between, for example, approximately 50 degrees and approximately 95 degrees.

Figure 8B:
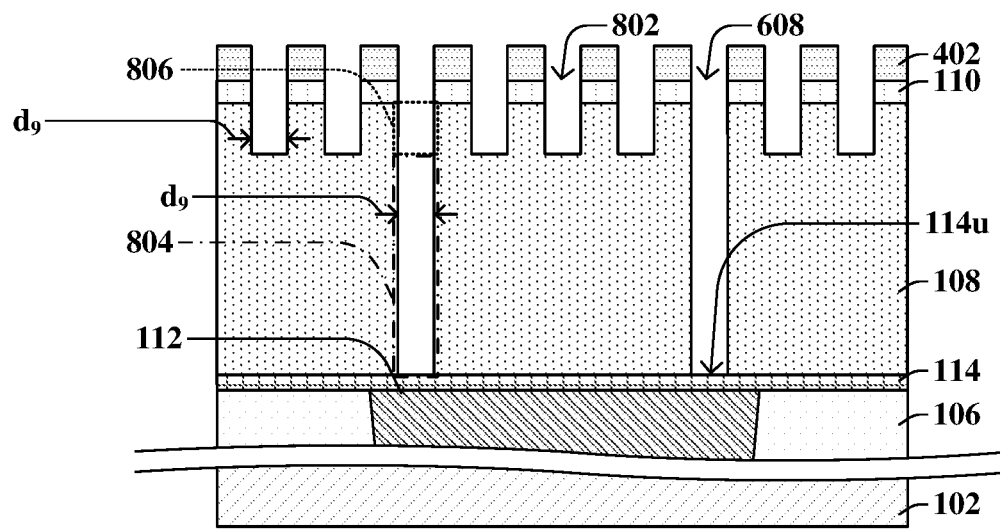

As shown in cross-sectional view 800B of FIG. 8B, in some embodiments, the second removal process also removes upper portions of the first interconnect dielectric layer 108 uncovered by the first hard mask structure 402 to form the second trench structure 802 within the first interconnect dielectric layer 108. In some embodiments, the second trench structure 802 may be coupled to the first trench structure 608 from certain cross-sectional view perspectives. For example, in the cross-sectional view 800B of FIG. 8B, a lower box 804 corresponds to a first trench structure 608 that exposes an upper surface 114$u$ of the etch stop layer 114, and an upper box 806 corresponds to a second trench structure 802 arranged over and in fluidic contact with the first trench structure 608. In some embodiments, the second trench structure 802 extends into and out of the page and will define an interconnect wire that will be coupled to an interconnect via formed within the first trench structure 608.

Figure 9A:
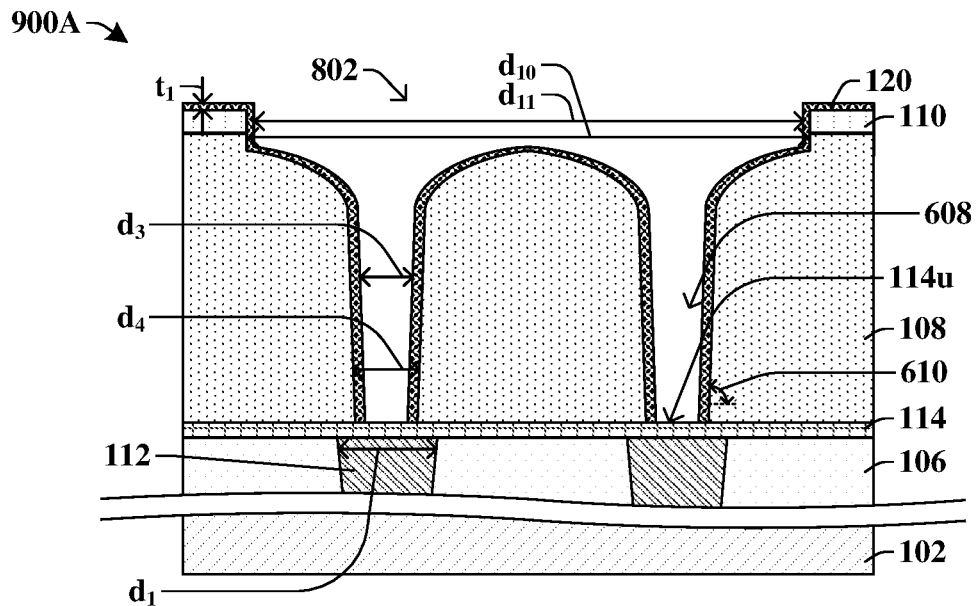

As shown in cross-sectional view 900A of FIG. 9A, in some embodiments, a protective layer 120 is selectively deposited on the first interconnect dielectric layer 108 and the second interconnect dielectric layer 110. In some embodiments, the first hard mask structure (402 of FIG. 8A) is removed prior to the formation of the protective layer 120. In such embodiments, the protective layer 120 is not deposited on the etch stop layer 114 at least in part because a difference in materials. In other words, in some embodiments, the protective layer 120 may comprise a different material than the first interconnect dielectric layer 108 and a different material than the etch stop layer 114. In some embodiments, the protective layer 120 may comprise, for example, a dielectric material, such as, for example, silicon carbide, silicon oxygen carbide, silicon dioxide, silicon nitride, silicon carbon nitride, silicon oxynitride, silicon oxygen carbon nitride, or a metal oxide such as, for example, aluminum oxide or aluminum nitrogen oxide. In some embodiments, the protective layer 120 has a first thickness ti in a range of between, for example, approximately 10 angstroms and approximately 800 angstroms. Thus, in some embodiments, the protective layer 120 reduces the width of the first trench structure 608 from the fourth distance $d_4$ to a third distance $d_3$. In some embodiments, the protective layer 120 reduces the width of the second trench structure 802 from the tenth distance $d_{10}$ to the eleventh distance $d_{11}$. In some embodiments, the protective layer 120 may be formed by a selective deposition process that utilizes, for example, CVD, PVD, ALD, or the like. Further, in some embodiments, the protective layer 120 is formed in a chamber set to a temperature in a range of between approximately 50 degrees Celsius and approximately 400 degrees Celsius, for example.

Figure 9B:
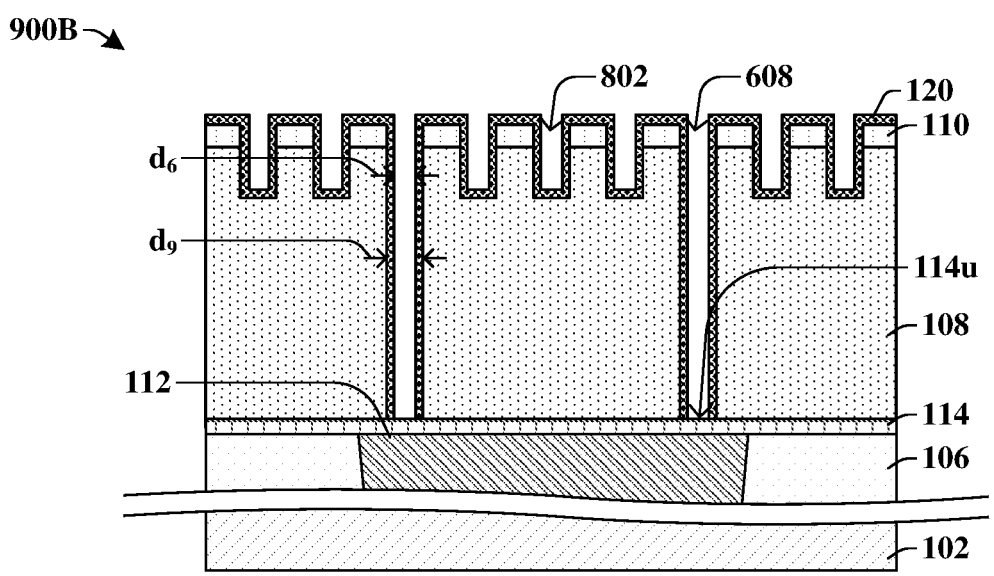

As shown in cross-sectional view 900B of FIG. 9B, the protective layer 120 reduces the width of the first and second trench structures 608, 802 from the ninth distance $d_9$ to the sixth distance $d_6$.

As shown in cross-sectional view 10A of FIG. 1000A, in some embodiments, a third removal process is conducted to remove portions of the etch stop layer 114 that are not covered by the protective layer 120 or by the first interconnect dielectric layer 108 in order to expose an upper surface 112u of the lower conductive structure 112. In some embodiments, the opening formed in the etch stop layer 114 has a width equal to the third distance $d_3$. The third distance $d_3$ is less than or equal to the first distance $d_1$ of the lower conductive structure 112. In some embodiments, the protective layer 120 ensures that the third distance $d_3$ is less than the first distance $d_1$ such that portions of the lower interconnect dielectric layer 106 do not become exposed and unintentionally removed by the third removal process. Further, in some embodiments, the protective layer 120 protects inner sidewalls of the first interconnect dielectric layer 108 from removal and/or damage by the third removal process.

Thus, in some embodiments, the protective layer 120 is substantially resistant to removal by and/or has a slower rate of removal by the third removal process than the etch stop layer 114. In some embodiments, the third removal process used to remove portions of the etch stop layer 114 may be or comprise, for example, ICP, CCP, or remote plasma using one or more of the following etchant gases: $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar, $CH_3OH$, $C_2H_5OH$, or some other suitable etchant gas. In some embodiments, the etching process is conducted in a chamber set to, for example, a pressure in a range of between approximately 0.2 millitorr and approximately 120 millitorr, a temperature in a range of between approximately 0 degrees Celsius and approximately 100 degrees Celsius, a power in a range of between approximately 50 Watts and approximately 3000 Watts, and a bias in a range of between approximately 0 volts and approximately 1200 volts. In yet other embodiments, the third removal process may comprise a wet clean etchant.

In some embodiments, the third removal process may be conducted in a substantially vertical direction, and substantially horizontal portions of the protective layer 120 arranged over upper surfaces of the first and second interconnect dielectric layers 108, 110 may be removed. Thus, in some embodiments, after the third removal process, upper surfaces of the first and second interconnect dielectric layers 108, 110 may be exposed and uncovered by the protective layer 120, whereas substantially vertical portions of the protective layer 120 remain on the first and second interconnect dielectric layers 108, 110.

Figure 10A:
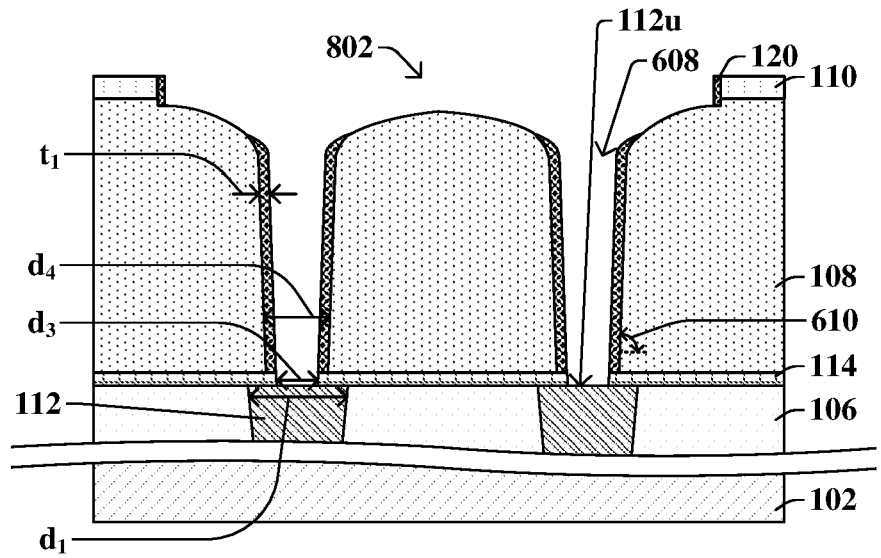
Figure 10B:
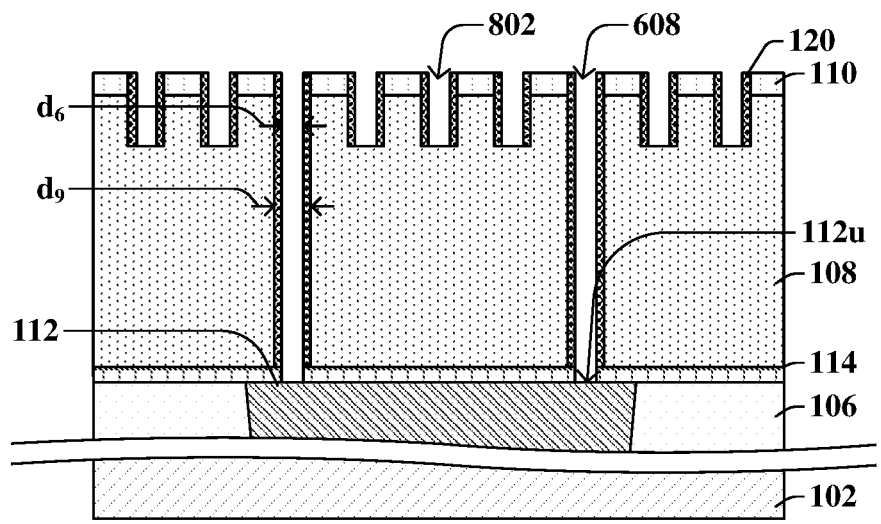

As shown in cross-sectional view 1000B of FIG. 10B, in some embodiments, the third removal process exposes the upper surface 112u of the lower conductive structure 112, and in some embodiments, may remove substantially horizontal portions of the protective layer 120.

Figure 10C:
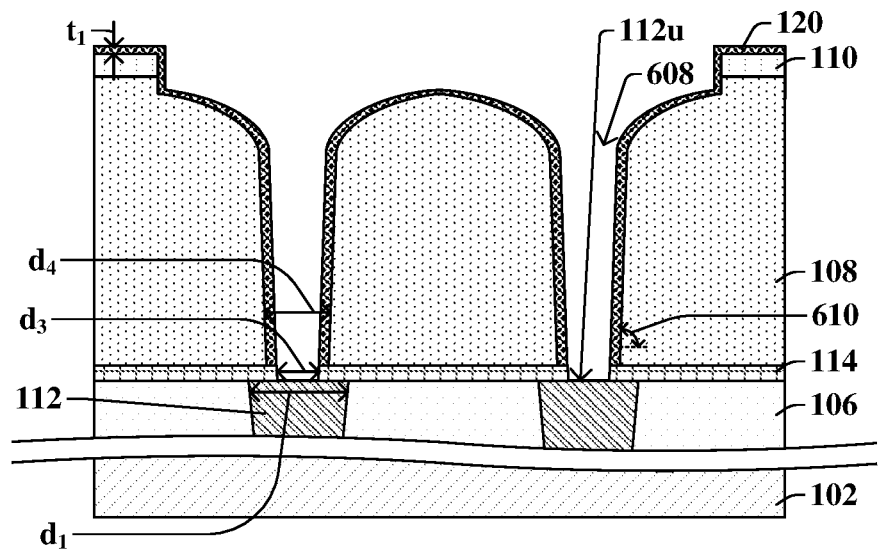
Figure 10D:
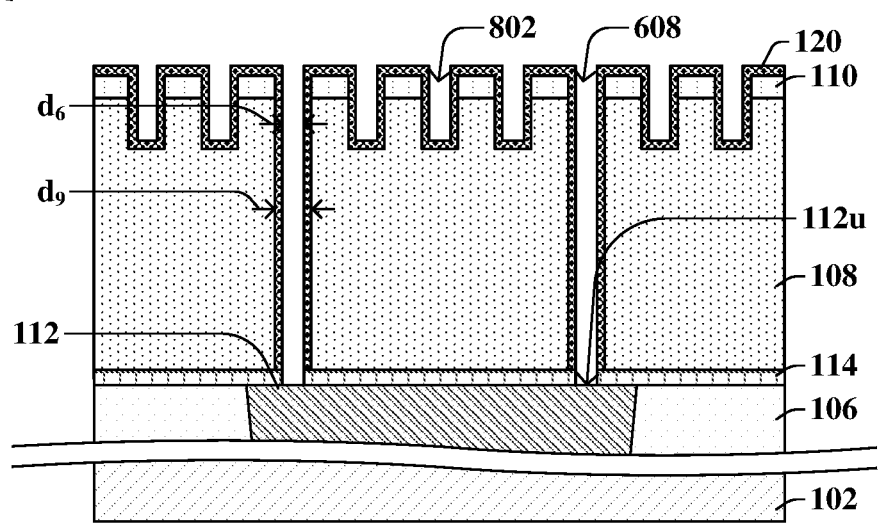

FIG. 10C illustrates a cross-sectional view 1000C of some alternative embodiments of the cross-sectional view 1000A of FIG. 10A, and FIG. 10D illustrates a cross-sectional view 1000D of some alternative embodiments of the cross-sectional view 1000B of FIG. 10B.

As shown in the cross-sectional view 1000C of FIG. 10C, in some embodiments, the protective layer 120 is substantially resistant to removal by the third removal process. In such embodiments, after the third removal process, upper surfaces of the first and second interconnect dielectric layers 108, 110 remain covered by the protection layer 120.

As shown in the cross-sectional view 1000D of FIG. 10D, in some embodiments, the protective layer 120 is substantially resistant to removal by the third removal process. In such embodiments, after the third removal process, upper surfaces of the first and second interconnect dielectric layers 108, 110 remain covered by the protection layer 120.

Figure 11A:
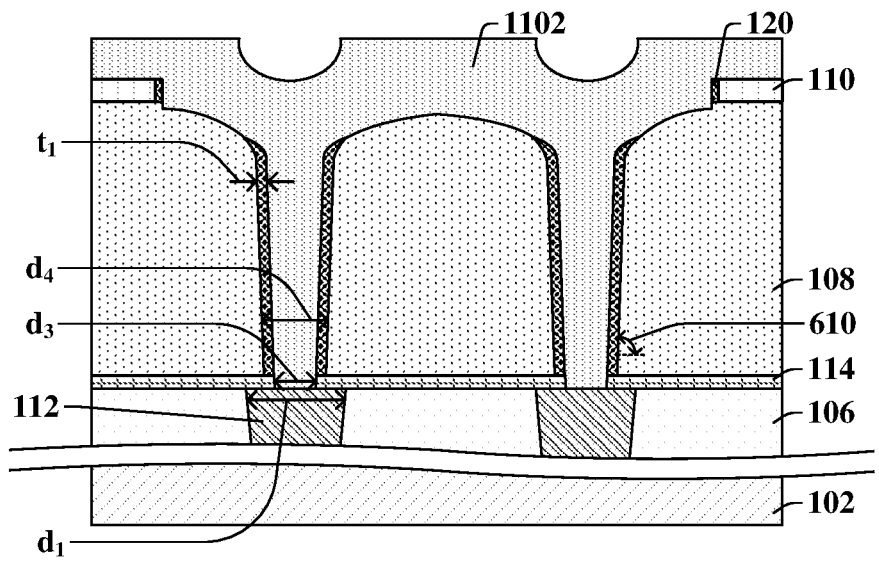
Figure 11B:
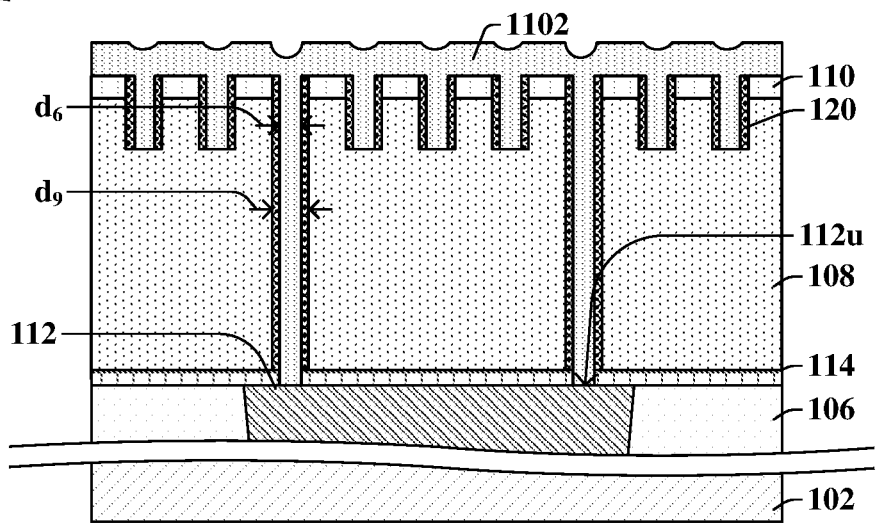

As shown in cross-sectional views 1100A and 1100B of FIGS. 11A and 11B, respectively, in some embodiments, a conductive material 1102 is formed over the lower conductive structure 112 to completely fill the first and second trench structures (608, 802 of FIGS. 10A and 10B). In some embodiments, prior to forming the conductive material 1102, a diffusion barrier layer (e.g., 322 of FIG. 3) may be formed on the protective layer 120 and first interconnect dielectric layer 108. In some embodiments, the conductive material 1102 contacts the lower conductive structure 112. In some embodiments, the conductive material 1102 may comprise, for example, tantalum, tantalum nitride, titanium nitride, copper, cobalt, ruthenium, molybdenum, iridium, tungsten, or some other suitable conductive material. Further, in some embodiments, the conductive material 1102 may be formed by way of a deposition process (e.g., PVD, CVD, ALD, spin-on, etc.) in a chamber set to a temperature of between, for example, approximately 150 degrees Celsius and approximately 400 degrees Celsius.

Figure 12A:
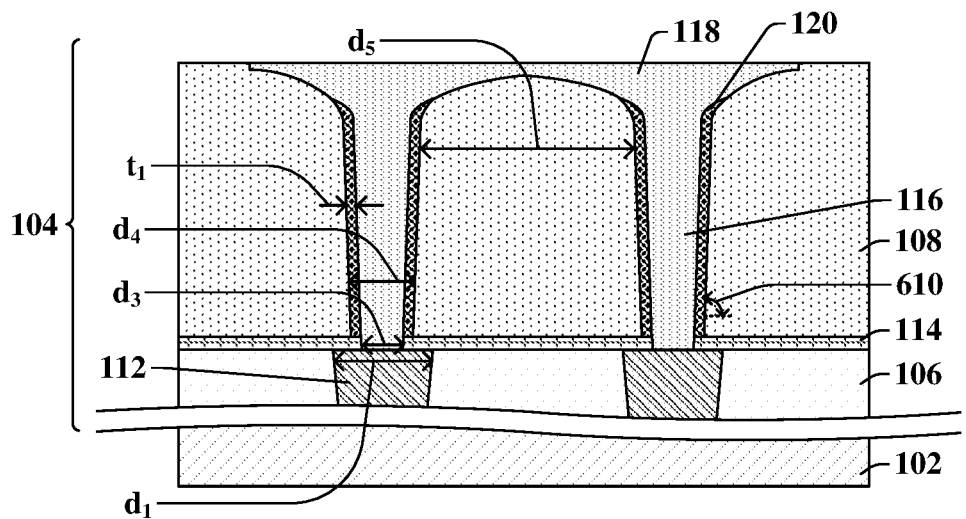
Figure 12B:
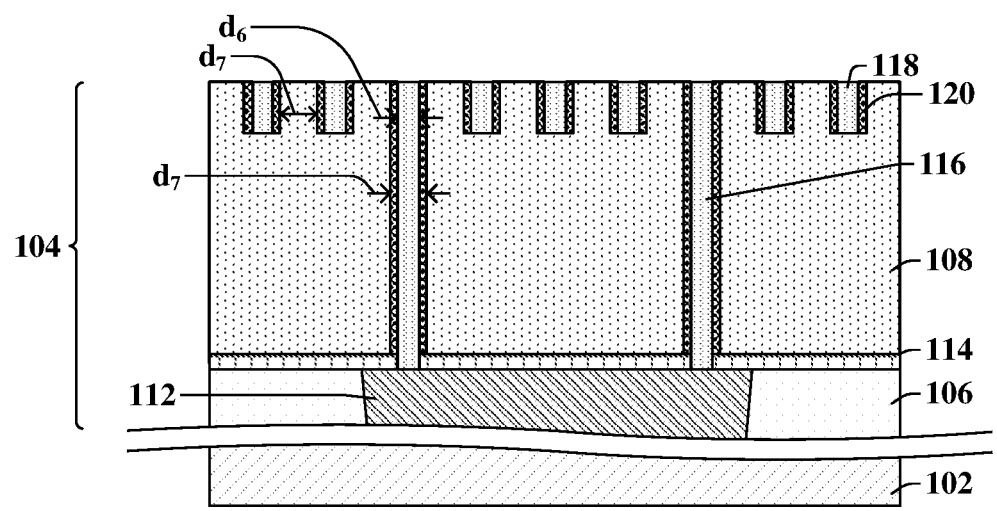

As shown in cross-sectional views 1200A and 1200B of FIGS. 12A and 12B, respectively, in some embodiments, a planarization process is performed to remove excess portions of the conductive material (1102 of FIGS. 11A and 11B) arranged over the first interconnect dielectric layer 108. In some embodiments, the planarization process (e.g., chemical mechanical planarization) also removes the second interconnect dielectric layer (110 of FIGS. 11A and 11B), whereas in other embodiments (not shown), the second interconnect dielectric layer (110 of FIGS. 11A and 11B) may remain over the first interconnect dielectric layer 108 after the planarization process.

Nevertheless, after the planarization process, an interconnect structure 104 is formed over the substrate 102 thereby forming an interconnect via 116 arranged within the first trench structure (608 of FIGS. 10A and 10B) of the first interconnect dielectric layer 108 and an interconnect wire 118 arranged within the second trench structure (802 of FIGS. 10A and 10B) of the first interconnect dielectric layer 108. The interconnect via 116 electrically couples the lower conductive structure 112 to the interconnect wire 118, and the interconnect structure 104 provides conductive pathways between various electronic devices (e.g., semiconductor devices, photo devices, memory devices, etc.) arranged above and below the interconnect structure 104.

The method in FIGS. 4A-12B may be referred to as a dual damascene process because the interconnect via 116 and the interconnect wire 118 were formed simultaneously to reduce manufacturing time and costs. It will be appreciated that the method of FIGS. 4A-12B may be modified to reflect a single damascene process, wherein the interconnect via 116 or the interconnect wire 118 is formed independently from one another. Nevertheless, the protective layer 120 may still be utilized to reduce the critical dimensions of the interconnect via 116 or the interconnect wire 118.

Because of the protective layer 120, the interconnect via 116 extends through an opening in the etch stop layer 114 having a width equal to the third distance $d_3$ that is less than or equal to the first distance $d_1$ of the lower conductive structure 112 to prevent unintentional removal of the lower interconnect dielectric layer 106 during patterning. Additionally, the critical dimension (e.g., $d_3$ and/or $d_6$) of the interconnect via 116 and the critical dimension (e.g., $d_6$) of the interconnect wire 118 is reduced by the protective layer 120 which advantageously increases the device density of the integrated chip. Further, because of the protective layer 120, a fifth distance $d_5$ between multiple interconnect vias 116 and the seventh distance $d_7$ between multiple interconnect wires 118 are increased which reduces capacitance and thus, cross-talk between the interconnect vias 116 and interconnect wires 118 to increase reliability of the interconnect structure 104 and thus, overall integrated chip.

Figure 12C:
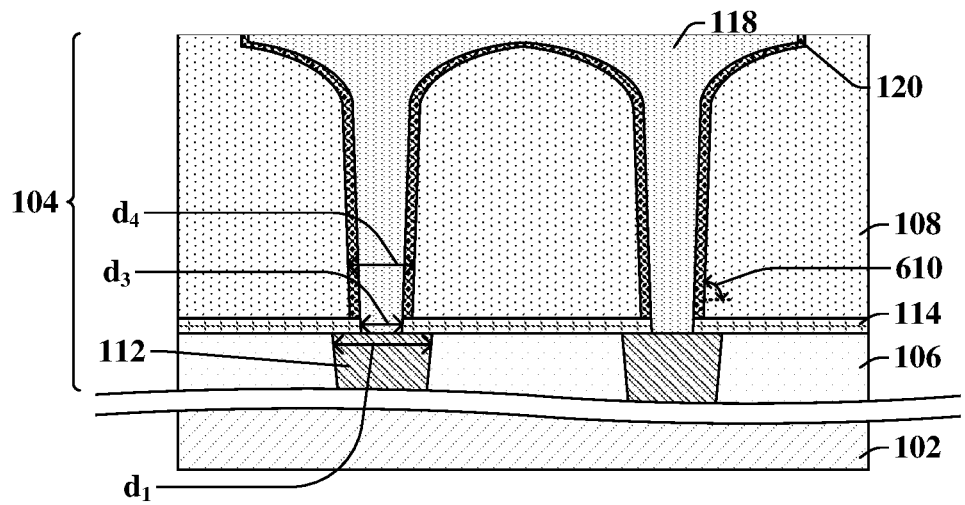
Figure 12D:
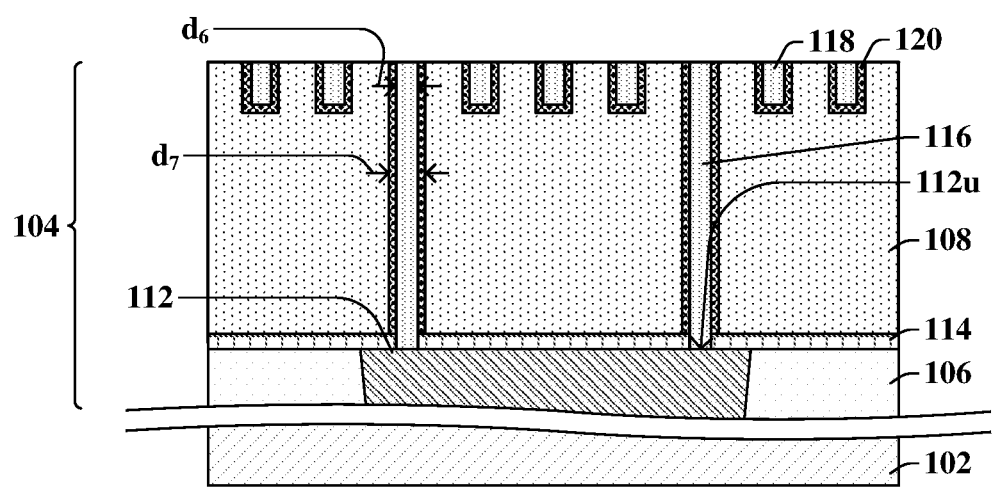

FIGS. 12C and 12D illustrate cross-sectional views 1200C and 1200D, respectively, of some alternative embodiments of the cross-sectional views 1200A and 1200B of FIGS. 12A and 12B, respectively. FIG. 12C illustrates the cross-sectional view 1200C of some embodiments wherein the protective layer 120 was not removed by the third removal process, as shown in FIG. 10C. FIG. 12D illustrates the cross-sectional view 1200D of some embodiments wherein the protective layer 120 was not removed by the third removal process, as shown in FIG. 10D. In such alternative embodiments of FIGS. 12C and 12D, the interconnect wire 118 may have outer and bottom surfaces covered by the protective layer 120.

Figure 13:
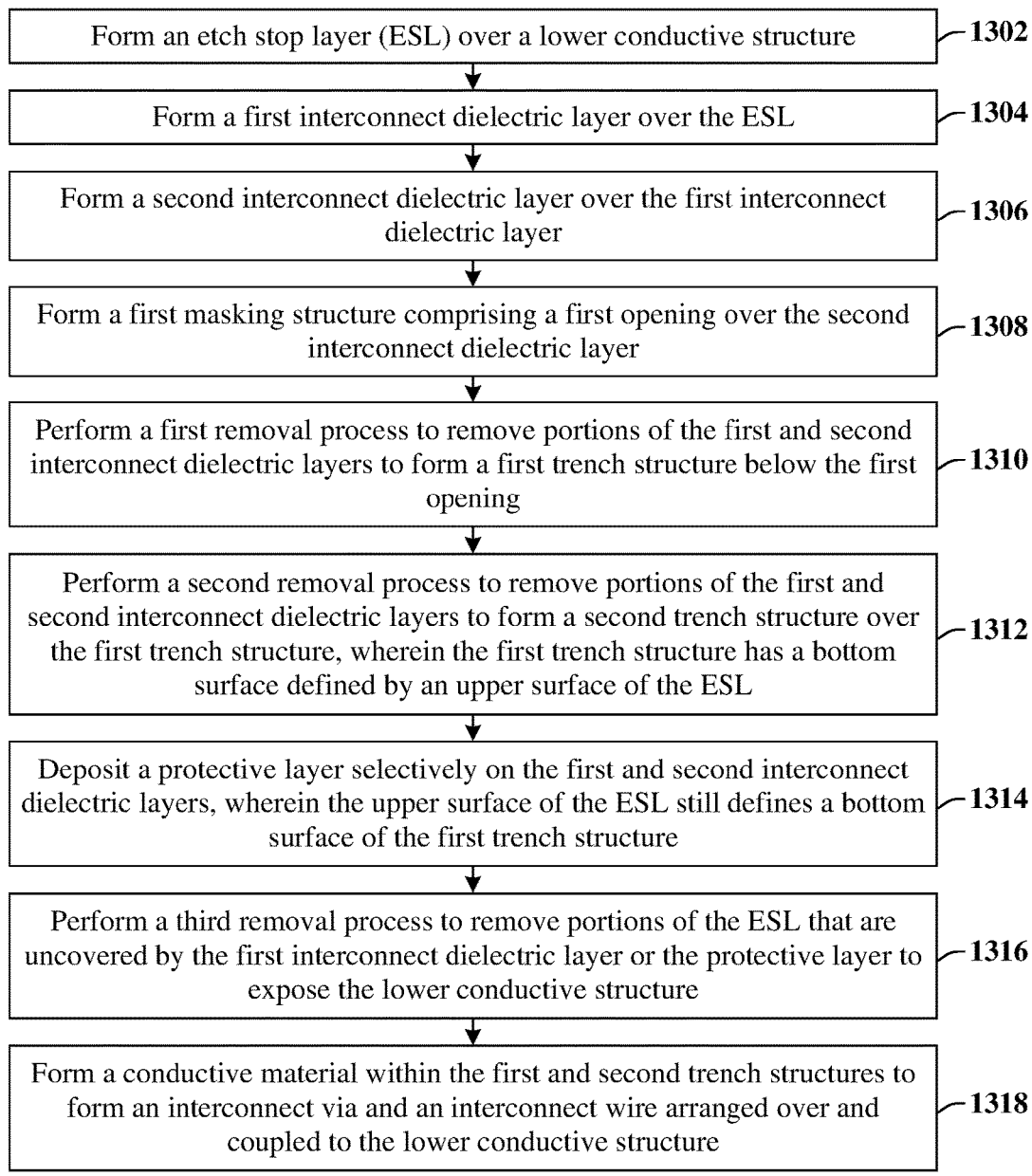
FIG. 13 illustrates a flow diagram of some embodiments of a method corresponding to the method of FIGS. 4A-12D.

FIG. 13 illustrates a flow diagram of some embodiments of a method 1300 corresponding to the method illustrated in FIGS. 4A-12D.

While method 1300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1302, an etch stop layer (ESL) is formed over a lower conductive structure.

At act 1304, a first interconnect dielectric layer is formed over the ESL.

At act 1306, a second interconnect dielectric layer is formed over the first interconnect dielectric layer. FIG. 4A illustrates a cross-sectional view 400A of some embodiments corresponding to acts 1302, 1304, and 1306.

At act 1308, a first masking structure comprising a first opening is formed over the second interconnect dielectric layer. FIG. 5A illustrates a cross-sectional view 500A of some embodiments corresponding to act 1308.

At act 1310, a first removal process is performed to remove portions of the first and second interconnect dielectric layers to form a first trench structure below the first opening. FIG. 6A illustrates a cross-sectional view 600A of some embodiments corresponding to act 1310.

At act 1312, a second removal process is performed to remove portions of the first and second interconnect dielectric layers to form a second trench structure over the first trench structure, wherein the first trench structure has a bottom surface defined by an upper surface of the ESL. FIG. 8A illustrates a cross-sectional view 800A of some embodiments corresponding to act 1312.

At act 1314, a protective layer is selectively deposited on the first and second interconnect dielectric layers, wherein the upper surface of the ESL still defines a bottom surface of the first trench structure. FIG. 9A illustrates a cross-sectional view 900A of some embodiments corresponding to act 1314.

At act 1316, a third removal process is performed to remove portions of the ESL that are uncovered by the first interconnect dielectric layer or the protective layer to expose the lower conductive structure. FIG. 10A illustrates a cross-sectional view 1000A of some embodiments corresponding to act 1316.

At act 1318, a conductive material is formed within the first and second trench structures to form an interconnect via and an interconnect wire arranged over and coupled to the lower conductive structure. FIG. 12A illustrates a cross-sectional view 1200A of some embodiments corresponding to act 1318.

Therefore, the present disclosure relates to a method of forming an integrated chip having an interconnect structure by using a dual damascene process, wherein a protective layer is selectively deposited on outer sidewalls of trenches formed during the dual damascene process to reduce a critical dimension of an interconnect via of the interconnect structure and to reduce damage of the interconnect structure to reduce the size without sacrificing the reliability of the overall integrated chip.

Accordingly, in some embodiments, the present disclosure relates to an integrated chip comprising: a lower conductive structure arranged over a substrate; an etch stop layer arranged over the lower conductive structure; a first interconnect dielectric layer arranged over the etch stop layer; an interconnect via extending through the first interconnect dielectric layer and the etch stop layer to directly contact the lower conductive structure; and a protective layer surrounding outermost sidewalls of the interconnect via.

In other embodiments, the present disclosure relates to an integrated chip comprising: a lower conductive structure arranged over a substrate; an etch stop layer arranged over the lower conductive structure; a first interconnect dielectric layer arranged over the etch stop layer; an interconnect via extending through the first interconnect dielectric layer and the etch stop layer to contact the lower conductive structure; an interconnect wire extending through the first interconnect dielectric layer and coupled to the interconnect via; and a protective layer surrounding outermost sidewalls of the interconnect via, wherein the protective layer comprises a bottommost surface that directly contacts an upper surface of the etch stop layer.

In yet other embodiments, the present disclosure relates to a method of forming a contact via, comprising: forming an etch stop layer (ESL) over a lower conductive structure; forming a first interconnect dielectric layer over the ESL; forming a second interconnect dielectric layer over the first interconnect dielectric layer; forming a first masking structure comprising a first opening over the second interconnect dielectric layer; performing a first removal process to remove portions of the first and second interconnect dielectric layers arranged below the first opening to form a first trench structure; performing a second removal process to remove portions of the first and second interconnect dielectric layers according to remaining portions of the first masking structure to form a second trench structure and to extend the first trench structure, wherein a bottom surface of the first trench structure is defined by an upper surface of the ESL; depositing a protective layer selectively on the first and second interconnect dielectric layers, wherein the upper surface of the ESL still defines the bottom surface of the first trench structure; performing a third removal process to remove portions of the ESL that are uncovered by the first interconnect dielectric layer or the protective layer to expose the lower conductive structure; and forming a conductive material within the first and second trench structures to form an interconnect via and an interconnect wire arranged over and coupled to the lower conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an interconnect, comprising:
forming an etch stop layer (ESL) over a lower conductive structure;
forming one or more dielectric layers over the ESL;
performing a first patterning process on the one or more dielectric layers to form interconnect opening;
performing a second patterning process on the one or more dielectric layers to increase a depth of the interconnect opening and expose an upper surface of the ESL;
selectively forming a protective layer on sidewalls of the one or more dielectric layers forming the interconnect opening;
performing a third patterning process to remove portions of the ESL that are uncovered by the one or more dielectric layers and the protective layer and to expose the lower conductive structure; and
forming a conductive material within the interconnect opening.

2. The method of claim 1, wherein the protective layer has lower surfaces contacting the ESL, as viewed in a cross-sectional view, the lower conductive structure extending from directly below the lower surfaces to laterally between the lower surfaces.

3. The method of claim 1, wherein the one or more dielectric layers separate a bottom of the interconnect opening from the ESL after the first patterning process.

4. The method of claim 1, wherein the protective layer is formed by a selective deposition process that leaves an opening between sidewalls of the protective layer, the opening exposing the ESL.

5. The method of claim 1,
wherein the one or more dielectric layers comprise a first dielectric layer and a second dielectric layer over the first dielectric layer; and
wherein the protective layer is formed to continuously extend from along a sidewall of the first dielectric layer to along a sidewall of the second dielectric layer.

6. The method of claim 1, wherein the one or more dielectric layers comprise a first dielectric layer and a second dielectric layer over the first dielectric layer, the protective layer being disposed along a sidewall of the second dielectric layer after the second patterning process.

7. The method of claim 6, further comprising:
performing a planarization process after forming the conductive material within the interconnect opening, wherein the planarization process removes the second dielectric layer and exposes an upper surface of the first dielectric layer.

8. A method of forming a contact via, comprising:
forming an etch stop layer (ESL) over a lower conductive structure;
forming a first interconnect dielectric layer over the ESL;
forming a second interconnect dielectric layer over the first interconnect dielectric layer;
forming a first masking structure comprising a first opening over the second interconnect dielectric layer;
performing a first removal process to remove portions of the first and second interconnect dielectric layers arranged below the first opening to form a first trench structure;
performing a second removal process to remove additional portions of the first and second interconnect dielectric layers according to remaining portions of the first masking structure to form a second trench structure and to extend the first trench structure, wherein a bottom surface of the first trench structure is defined by an upper surface of the ESL;
depositing a protective layer selectively on the first and second interconnect dielectric layers, wherein the upper surface of the ESL still defines the bottom surface of the first trench structure;
performing a third removal process to remove additional portions of the ESL that are uncovered by the first interconnect dielectric layer or the protective layer to expose the lower conductive structure; and
forming a conductive material within the first and second trench structures to form an interconnect via and an interconnect wire arranged over and coupled to the lower conductive structure.

9. The method of claim 8, wherein the first opening of the first masking structure has a first width, and wherein the interconnect via has a second width less than the first width.

10. The method of claim 8, wherein the third removal process comprises use of an etchant, and wherein the protective layer is substantially resistant to removal by the etchant.

11. The method of claim 8, further comprising:
performing a fourth removal process to remove portions of the conductive material arranged above the first interconnect dielectric layer and to completely remove the second interconnect dielectric layer.

12. The method of claim 8, wherein after the selective deposition of the protective layer, the protective layer comprises substantially horizontal portions and substantially vertical portions, and wherein the third removal process removes the substantially horizontal portions of the protective layer.

13. The method of claim 8, wherein the first masking structure comprises a first masking layer and a second masking layer.

14. The method of claim 13, wherein the first masking structure further comprises a third masking layer extending from over the second masking layer to directly between sidewalls of the first masking layer and the second masking layer.

15. A method of forming an interconnect, comprising:
forming an etch stop structure over a lower conductive structure;
forming one or more dielectric layers over the etch stop structure;
performing a first patterning process on the one or more dielectric layers to form an interconnect opening;
forming a protective layer on one or more sidewalls of the one or more dielectric layers that form the interconnect opening, the protective layer being formed by a selective deposition process that deposits the protective layer to have an opening between sidewalls of the protective layer, the opening exposing the etch stop structure;

performing a second patterning process to remove a part of the etch stop structure that is laterally between the sidewall of the protective layer; and forming a conductive material within the interconnect opening.

16. The method of claim 15, wherein the protective layer comprises a dielectric material.

17. The method of claim 15, wherein the protective layer comprises silicon carbide, silicon oxygen carbide, silicon dioxide, silicon nitride, silicon carbon nitride, silicon oxynitride, silicon oxygen carbon nitride, or a metal oxide.

18. The method of claim 15, wherein the protective layer has a thickness in a range of between approximately 10 angstroms and approximately 800 angstroms.

19. The method of claim 15, wherein the protective layer has a curved surface that laterally surrounds the conductive material and that extends to an outermost edge of the protective layer that is disposed directly over the one or more dielectric layers.

20. The method of claim 15, further comprising:

performing a planarization process on the conductive material to form an interconnect, wherein the interconnect has a first pair of opposing sidewalls as viewed from a first cross-sectional view extending along a first direction and a second pair of opposing sidewalls as viewed from a second cross-sectional view extending along a second direction perpendicular to the first direction, the first direction and the second direction being both parallel to a top surface of the etch stop structure;

wherein the protective layer continuously extends from the etch stop structure to a top of the interconnect along the first pair of opposing sidewalls; and wherein the protective layer continuously extends from the etch stop structure to an upper surface that is a non-zero distance below the top of the interconnect along the second pair of opposing sidewalls.

* * * * *